(12) United States Patent
Li

(10) Patent No.: US 9,057,488 B2
(45) Date of Patent: Jun. 16, 2015

(54) LIQUID-COOLED LED LAMP

(71) Applicant: Wavien, Inc., Valencia, CA (US)

(72) Inventor: Kenneth Li, Castaic, CA (US)

(73) Assignee: WAVIEN, INC., Valencia, CA (US)

(*) Notice: Subject to any disclaimer, the term of this patent is extended or adjusted under 35 U.S.C. 154(b) by 0 days.

(21) Appl. No.: 13/839,728

(22) Filed: Mar. 15, 2013

(65) Prior Publication Data

US 2014/0232252 A1 Aug. 21, 2014

Related U.S. Application Data

(60) Provisional application No. 61/765,287, filed on Feb. 15, 2013.

(51) Int. Cl.
| | |
|---|---|
| *H01L 33/64* | (2010.01) |
| *F21K 99/00* | (2010.01) |
| *F21V 3/04* | (2006.01) |
| *F21Y 101/02* | (2006.01) |
| *F21Y 113/00* | (2006.01) |

(52) U.S. Cl.
CPC . *F21K 9/56* (2013.01); *H01L 33/64* (2013.01); *F21K 9/135* (2013.01); *F21V 3/0418* (2013.01); *F21V 3/0436* (2013.01); *F21Y 2101/02* (2013.01); *F21Y 2113/005* (2013.01); *F21V 29/58* (2015.01); *F21V 29/74* (2015.01)

(58) Field of Classification Search
CPC ........................................................ H01L 33/64
USPC ........................................ 362/296.01–296.05
See application file for complete search history.

(56) References Cited

U.S. PATENT DOCUMENTS

| | | |
|---|---|---|
| 5,005,108 A | 4/1991 | Pristash et al. |
| 5,137,079 A | 8/1992 | Anderson |
| 5,142,387 A | 8/1992 | Shikama et al. |
| 5,305,184 A | 4/1994 | Andresen et al. |
| 5,373,417 A | 12/1994 | Barrett |
| 5,400,426 A | 3/1995 | de Jong et al. |
| 5,982,540 A | 11/1999 | Koike et al. |
| 6,144,536 A | 11/2000 | Zimmerman et al. |
| 6,227,682 B1 | 5/2001 | Li |
| 6,234,765 B1 | 5/2001 | Deak |
| 6,341,876 B1 | 1/2002 | Moss et al. |
| 6,869,206 B2 | 3/2005 | Zimmerman et al. |

(Continued)

OTHER PUBLICATIONS

Hoepfner: "61.1: Invited Paper: PhlatLight (tm) Photonic Lattice LEDs for RPTV Light Engines," SID 06 Digest, 1808-1811 (2006).

(Continued)

*Primary Examiner* — Mary Ellen Bowman
(74) *Attorney, Agent, or Firm* — Abelman, Frayne & Schwab

(57) ABSTRACT

An electrical device, preferably a light bulb having an electrical base, comprises a container having a sealed interior, an electrical component contained within the sealed interior; a liquid filling the sealed interior; and a pressure relief member. The pressure relief member has an interior tubular passage. The tubular passage has an inlet which is in fluid communication with the liquid. The tubular passage is filled with liquid from the inlet partially toward an outer end of the passage. The remainder of the passage is filled with gas. The pressure relief member provides relief from increases of pressure caused by heating the liquid. Preferably, a heat sink is provided for the electrical component and contacts the liquid coolant. The pressure relief member may be located either in the sealed interior or outside of the container.

20 Claims, 7 Drawing Sheets

(56) References Cited

U.S. PATENT DOCUMENTS

| | | |
|---|---|---|
| 7,052,150 B2 | 5/2006 | Dewald |
| 7,390,116 B2 | 6/2008 | Jain |
| 7,494,228 B2 | 2/2009 | Harbers et al. |
| 2004/0002169 A1 | 1/2004 | Kraus et al. |
| 2004/0004435 A1 | 1/2004 | Hsu |
| 2004/0233679 A1 | 11/2004 | Ferri et al. |
| 2005/0002169 A1 | 1/2005 | Drazic et al. |
| 2005/0168990 A1 | 8/2005 | Nagata et al. |
| 2005/0207177 A1 | 9/2005 | Guy |
| 2005/0225866 A1 | 10/2005 | Abu-Ageel |
| 2006/0008237 A1 | 1/2006 | Imade |
| 2006/0062013 A1 | 3/2006 | Imade |
| 2006/0090881 A1 | 5/2006 | Tuma |
| 2006/0144570 A1 | 7/2006 | Crocker et al. |
| 2006/0203352 A1 | 9/2006 | Pashley |
| 2006/0209545 A1 | 9/2006 | Yu |
| 2006/0262514 A1 | 11/2006 | Conner et al. |
| 2007/0058059 A1 | 3/2007 | Suehiro |
| 2007/0133171 A1 | 6/2007 | Cheon |
| 2007/0236956 A1 | 10/2007 | Kolodin et al. |
| 2007/0284565 A1 | 12/2007 | Leatherdale et al. |
| 2007/0291491 A1 | 12/2007 | Li et al. |
| 2008/0030974 A1 | 2/2008 | Abu-Ageel |
| 2008/0093962 A1* | 4/2008 | Kim et al. ............... 313/46 |
| 2008/0219007 A1 | 9/2008 | Heffington et al. |
| 2009/0001372 A1 | 1/2009 | Arik et al. |
| 2009/0015125 A1 | 1/2009 | Shuy |
| 2009/0141491 A1 | 6/2009 | Chu |
| 2010/0045937 A1 | 2/2010 | Li |
| 2010/0108297 A1* | 5/2010 | Chen .................. 165/104.26 |
| 2010/0328950 A1 | 12/2010 | Lai et al. |
| 2011/0261563 A1 | 10/2011 | Li |
| 2012/0033440 A1* | 2/2012 | Wheelock et al. ........... 362/555 |

OTHER PUBLICATIONS

"LED Light Bulb—4W Globe—Eternaleds HydraLux-4," eternaleds.com, 2007.

\* cited by examiner

LIQUID-COOLED LED LAMP

CROSS-REFERENCE TO RELATED APPLICATIONS

The present application claims priority on U.S. provisional application No. 61/765,287, filed on Feb. 15, 2013.

BACKGROUND OF THE INVENTION

The present invention relates to a lighting device and more particularly to an LED lighting device in which one or more LEDs are contained within a rigid, sealed container containing a liquid coolant. The container may be an Edison-type light bulb.

For many LED applications, it is important to remove heat generated by the LED. For such reason, LEDs are typically mounted on a metal substrate and the substrate is mounted on a heat sink with cooling fins. A fan can then be used to blow air over the heat sink fins to cool the LED chip.

However, due to the relatively large distance between the LED chip and the heat sink fins, the cooling efficiency is usually low. As a result, the LED junction operates at higher temperatures, which reduces the light output and lifetime of the LED chip.

My prior U.S. patent application Ser. No. 13/092,112 discloses an LED lamp which includes a sealed housing containing an LED. The housing is filled with a liquid coolant which is in contact with the LED and the heat sink on which the LED package is mounted. When the lamp is turned on, the liquid coolant cools the LED element, thereby providing higher light output and increased lifetime of the LED element.

As the LED continues to operate, the liquid heats up and expands in volume. In the case of a rigid housing such as a glass light bulb, such expansion could cause the bulb to crack or break. To compensate, my prior invention employs an enclosure containing compressible material, which is positioned within the bulb. The enclosure containing the compressible material compresses in response to expansion of the liquid coolant as the liquid absorbs heat from the LED element.

SUMMARY OF THE INVENTION

A system, preferably a light bulb having an electrical base, comprises a container having a sealed interior, an electrical component contained within the sealed interior; a liquid coolant filling the sealed interior; and a pressure relief member. The pressure relief member has an interior tubular passage. The tubular passage has an inlet which is in fluid communication with the liquid coolant. The tubular passage is partially filled with liquid which extends from the inlet partially toward an outer end of the passage. The remainder of the passage is filled with gas when the end is enclosed. When the end is open to the air, the length of the passage is sufficient long such that the liquid will not escape at the highest operating temperature.

The tubular passage is preferably engineered such that the liquid inside will form a meniscus at the liquid/air interface with sufficient adhesion that the interface will remain intact when the system is subjected to normal shock and vibration, which can occur, for example, during normal operation and shipment.

The pressure relief member provides relief from increases of pressure caused by heating the liquid. Preferably, a heat sink is provided for the electrical component and contacts the liquid coolant.

The pressure relief member may be located either in the sealed interior or outside of the container. In one embodiment, the pressure relief member is a expansion tube whose outer end is closed. In another embodiment, the expansion tube's outer end is open. The open end may be connected to an expansion chamber or left open without any connections. Without having the outer end closed or connected to an expansion chamber, the pressure inside the light bulb will remain at the outside atmospheric pressure.

In an alternate embodiment, a phosphor material, which may be a powder phosphor or ceramic phosphor, is secured to the heat sink 5 in place of an LED. An external laser is provided, whose output is directed at the phosphor material.

In a preferred embodiment, the light bulb is an Edison-type light bulb with a bulb portion and a neck. The expansion tube may be coiled around the neck. In yet another embodiment, the expansion tube may be a coil located inside the sealed bulb.

In yet another embodiment, the pressure relief member is a frusto-conical member having a core and an outer shell. A helical groove is formed on the outside surface of the core and, when covered by the outer shell, forms the tubular passage for containing air and liquid.

DETAILED DESCRIPTION OF THE INVENTION

Figure 1:
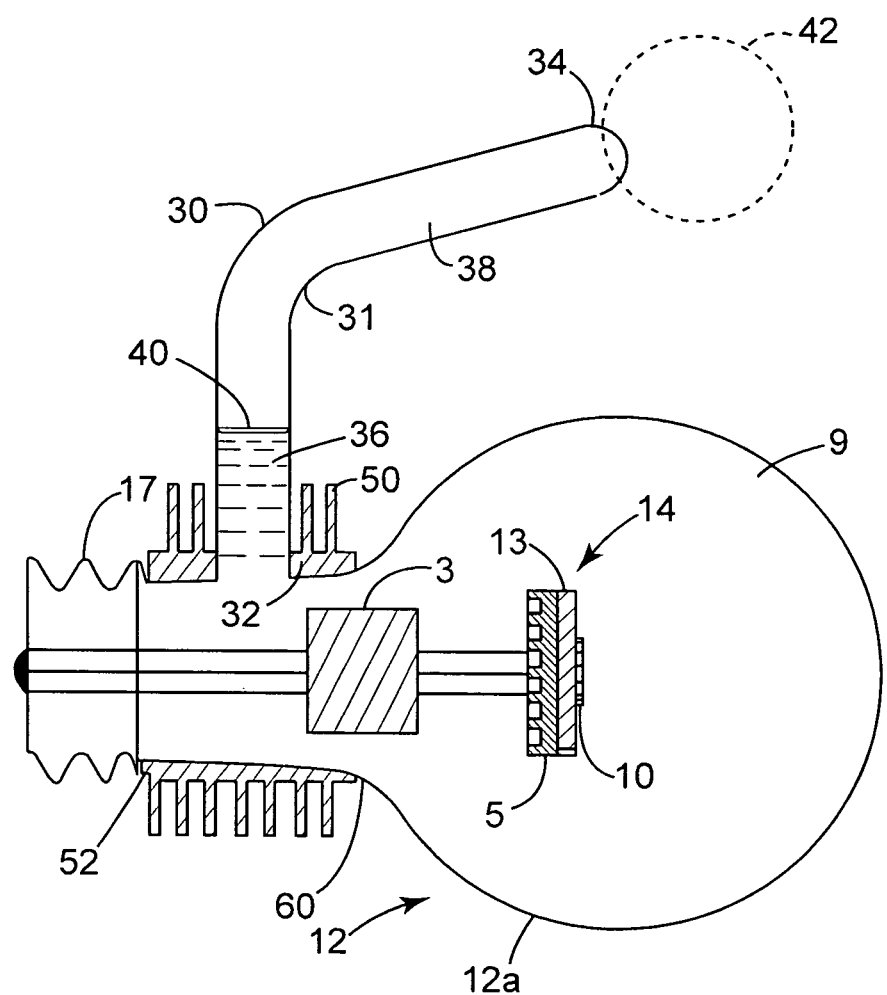
FIG. 1 is a side view of a first embodiment of a liquid-cooled LED light bulb according to the invention.

FIG. 1 shows an LED lighting device according to one embodiment of the present invention. The LED lighting device includes a container 12 with a sealed interior, for example an Edison-type light bulb 12*a* having a screw-threaded base 17 for use in a standard electrical socket. Other type of sockets or other connectors may be used for other applications. The sealed bulb 12*a* can be made of plastic, glass or metal. The interior of the sealed container 12 includes an LED package 14, a heat sink 5 in thermal communication with the LED 10, and liquid coolant 9.

The LED package 14 includes at least one LED 10 which is typically an LED element having an emitting area that emits light and a substrate 13 on which the chip is mounted. The heat sink 5 is attached to the substrate 13 to carry heat away from the LED chip 10. Such LED packages, for example, are available from Luminus Devices, Inc. of Billerica, Mass.

Liquid coolant 9 fills the container 12 and either contacts the LED 10 or is in indirect contact therewith, so that any heat generated by the LED will be transferred by conduction into the liquid coolant. Preferably, the liquid coolant 9 has low thermal expansion and high heat conductivity, is chemically inert, and includes electrically insulating characteristics. One such liquid coolant is a perfluorinated liquid coolant called Fluorinert© available from 3M Company of St. Paul, Minn. Other lower cost liquid coolants can be mineral oil, paraffin, silicone oil, or the like.

The LED lamp further includes a driver circuit 3 for driving the LED 10. The LED package 14 can be a single chip 10 or multiple chips of white color, single color, or multiple colors. The LED elements 10 are preferably arranged in the same plane and closely positioned to minimize any space between any two emitting areas of the LED elements. The LED elements 10 can emit light of a single color such as red, green and blue or emit white light. The emission angle is typically 180 degrees or less. The LED can also be a DC LED, or an AC LED.

An LED mount 28 is attached to the base 17 and provides a rigid support structure for attaching the control circuit 3, heat sink 5, substrate 13 and LED 10.

Although FIG. 1 shows a light bulb having an Edison type threaded base connector, any other LED lighting devices such as one having MR-16 type base are also suitable for use with the present invention.

The LED 10 generates heat when emitting light. The heat in turn heats the liquid coolant 9 which expands in volume. Since the liquid coolant 9 is sealed inside the bulb 12a, a relief member is provided to compensate for the expansion of the liquid coolant. As shown in FIG. 1, in this embodiment of the invention the relief member is an expansion tube 30 having a first end 32 which is in liquid communication with the interior of the bulb 12a. The tube 30 is preferably engineered such that the liquid inside the tube will form a meniscus at the liquid/air interface with sufficient adhesion that the interface will remain intact when the system is subjected to normal shock and vibration, such as can occur during shipping.

The opposite end 34 of the expansion tube is closed. The expansion tube 30 is partly filled with liquid 36 and partly filled with air 38 or another gas. The expansion tube 30 may be made of any suitable material including glass, metal, or plastic, and may be formed with an elbow such that the tube 30 extends an initial distance perpendicular to the longitudinal axis of the bulb 12a. At the elbow 31, the tube bends approximately 90 degrees to extend in a direction generally parallel to the axis.

When the LED is turned on, the liquid 9 is heated up and expands. Excess volume of liquid coolant 9 will flow into the expansion tube 30 to compress the air 38 to control the increase in pressure and prevent the bulb from breaking. Alternately, the air 38 can be partially evacuated in a manner similar to that used in thermometers. As the light bulb is turned on and off, cycling through heated and cooled states, liquid will flow from the bulb 12a alternately into and back from the expansion tube 30. The interior volume of the expansion tube 30 is determined by the volume of the bulb, and thereby the amount of liquid coolant 9 present.

The improved heat sink provided by the liquid coolant 9 results in higher output from the LED 10 using the same power. It also allows the LED 10 to operate at a higher wattage, resulting in a brighter output.

When used, the light bulb may have various orientations, depending upon the fixture in which it is used. Therefore, it is important that the meniscus 40 remain above the lower end 32 of the expansion tube 30 so that some liquid 36 always be present inside the expansion tube 30 and such that air inside the expansion tube 30 remains within the expansion tube 30. In order to do so, the diameter of the expansion tube interior is made small enough that air 38 will not enter the light bulb 12a regardless of the orientation of the bulb when used.

In a variation of the above embodiment, the outer end 34 of the expansion tube 30 may be connected to an expansion chamber 42 (shown schematically in broken lines). Also, for further cooling, a plurality of cooling fins 50 may be provided around the neck portion 60. The fins 50 lie in planes perpendicular to the axis of the light bulb 12 and project radially from the neck portion 60 in all directions (except where the expansion tube 30 interferes). The fins 50 may be mounted on an annular collar 52 which surrounds the neck portion 60.

Figure 2:
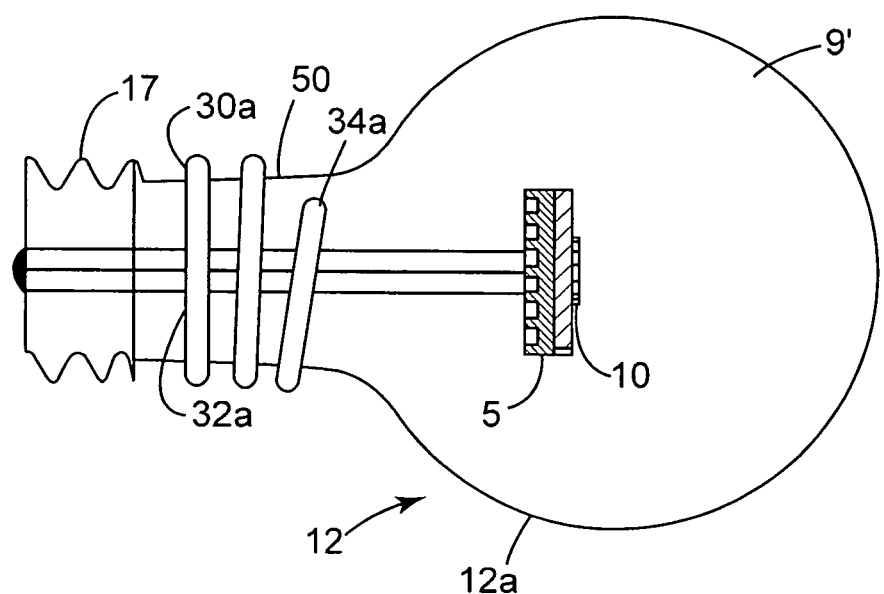
FIG. 2 is a side view of a second embodiment of a liquid-cooled LED light bulb according to the invention.

FIG. 2 shows a second embodiment in which the relief member is an expansion tube 30a. In FIG. 2, the expansion tube 30a is located on the outside of the neck portion 50 of the light bulb and wraps spirally around the neck portion 60. One end 32a of the expansion tube 30a communicates with the interior of the light bulb 12a. The opposite end 34a of the expansion tube 30a is closed.

Figure 3:
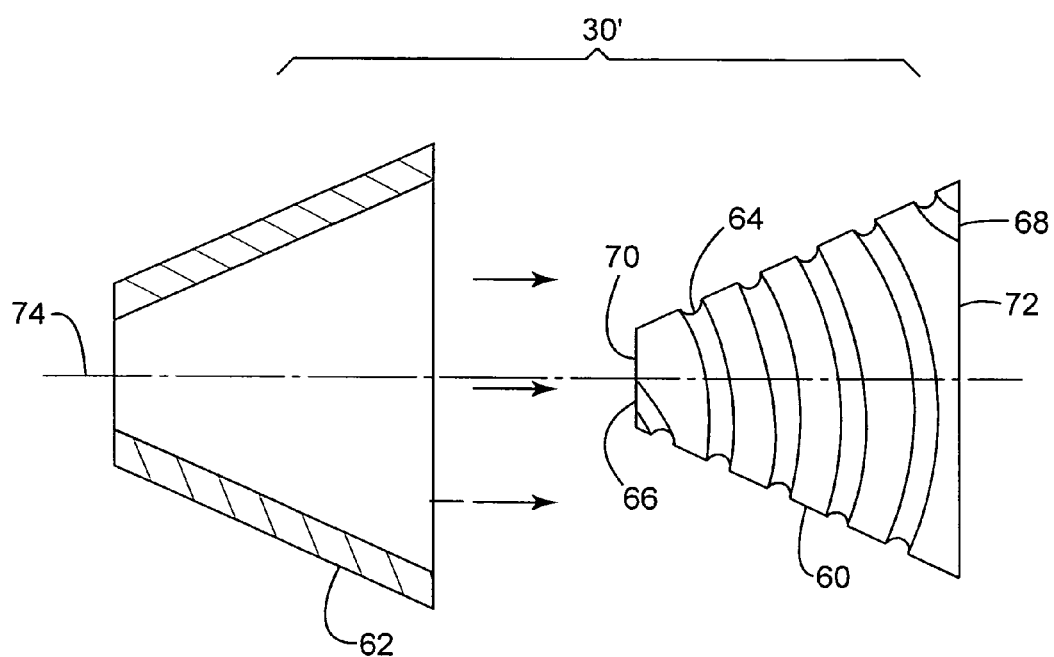
FIG. 3 is an exploded side view of an alternative embodiment of a pressure relief member for use with the liquid-cooled LED light bulb according to the invention.

FIG. 3 shows an alternative embodiment of a pressure relief member 30' which may be used in place of the expansion tubes 30, 30a shown in connection with FIGS. 1-2. The pressure relief member 30' contains an inner, frusto-conical core 60 and an outer, hollow, frustoconical shell 62. The core 60 contains, on its outer surface, a helical groove 64 having an inlet 66 and an outlet 60 located on opposed faces 70, 72 which lie in planes perpendicular to the center axis 74 of the pressure relief member 30'. Thus, when the core 60 is inserted into the shell 62, the resulting member 30' will include a helical passage 64 whose inlet 66 and outer end 68 are open. If desired, however, the outer end 68 may be closed, as in FIGS. 1 and 2. Again, the helical passage 64 preferably has a diameter such that the liquid inside the passage will form a meniscus at the liquid/air interface with sufficient adhesion that the interface will remain intact when the system is subjected to normal shock and vibration, e.g., during shipment.

In use, the inlet 66 of the pressure relief member 30' is placed in fluid communication with the liquid 9 in the interior of the bulb 12a by any suitable means. Alternatively, the pressure relief member 30' may be disposed within the bulb 12a, in a manner similar to that to be described in connection with FIG. 5. In such case, the outer end 68 would be closed.

Figure 4:
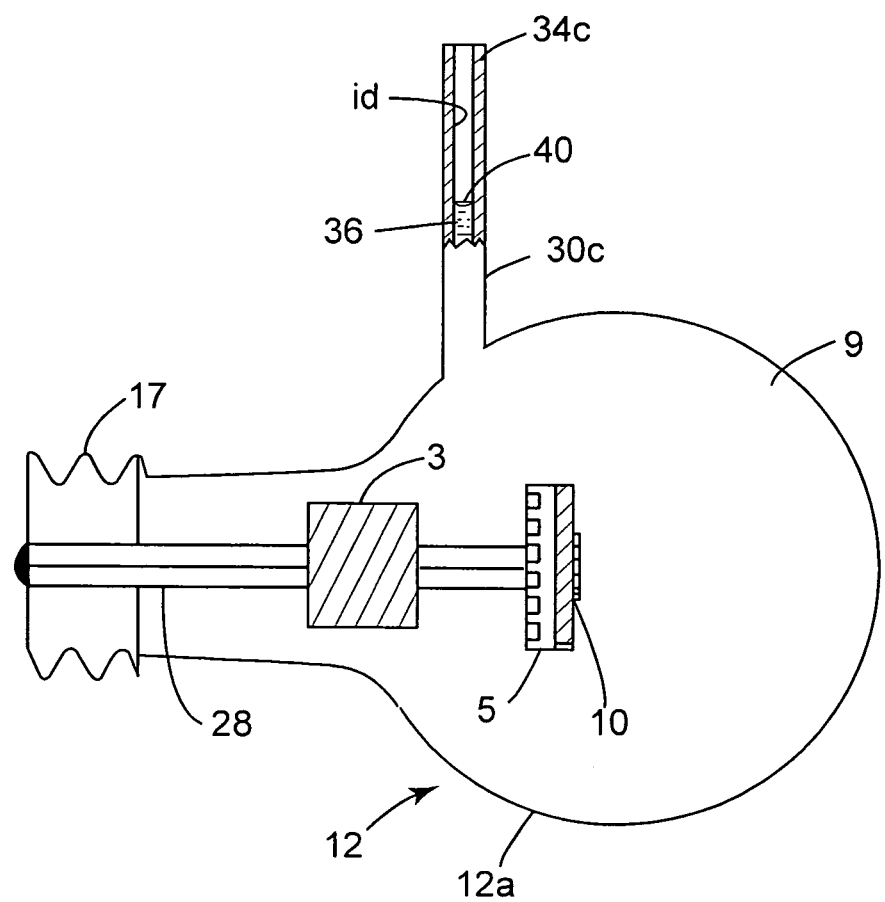
FIG. 4 is a side view of a third embodiment of a liquid-cooled LED light bulb according to the invention.

In the embodiment of FIG. 4, the expansion tube 30c, which is in fluid communication with the liquid 9, has an outer end 34c which is open to the atmosphere. Thus, when the fluid 9 expands, there is no pressurization of the air inside the expansion tube 30c or the fluid 9.

The inside diameter "id" of the expansion tube 30c is kept small enough such that surface tension will keep the meniscus 40 intact such that air will not travel across the meniscus 40 and reach the liquid 9. The length of the expansion tube 30c is sufficient such that liquid 36 inside the expansion tube 30c will not overflow beyond the open end 34c at steady state conditions at the highest-designed operating temperature.

Figure 5:
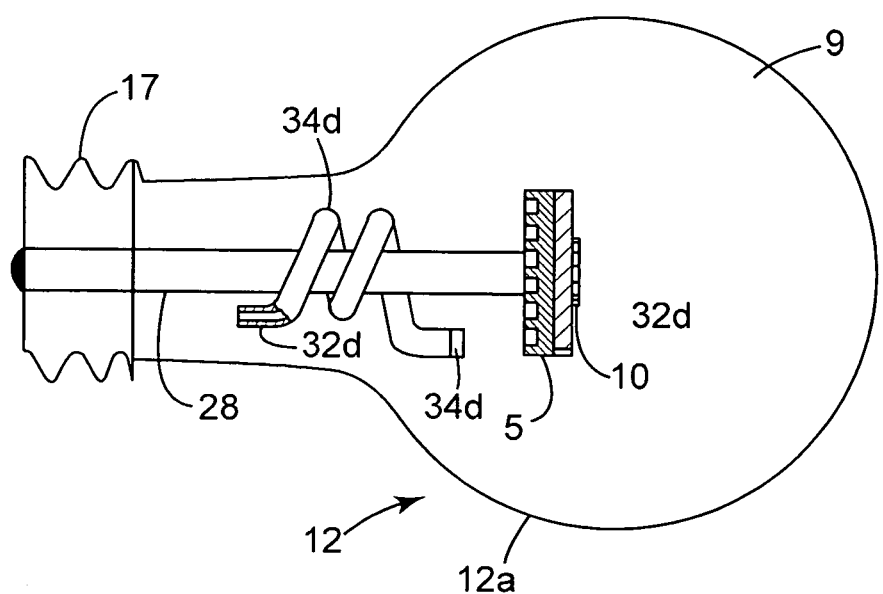
FIG. 5 is a side view of a fourth embodiment of a liquid-cooled LED light bulb according to the invention.

FIG. 5 shows an embodiment of an LED light bulb with LEDs 10 mounted on a heat sink 5. An expansion tube 34d is coiled around the stem 28 (and may be supported by the stem 28) in the interior of the bulb 12a. The tube 34d has an open, lower end 32d and a closed upper end 34d. The interior of the expansion tube 34d is partly filled with air, and the interior diameter of the expansion tube 34d is small enough so that air remains inside the tube 34d and does not escape into the liquid 9 regardless of the orientation of the bulb.

Figure 6:
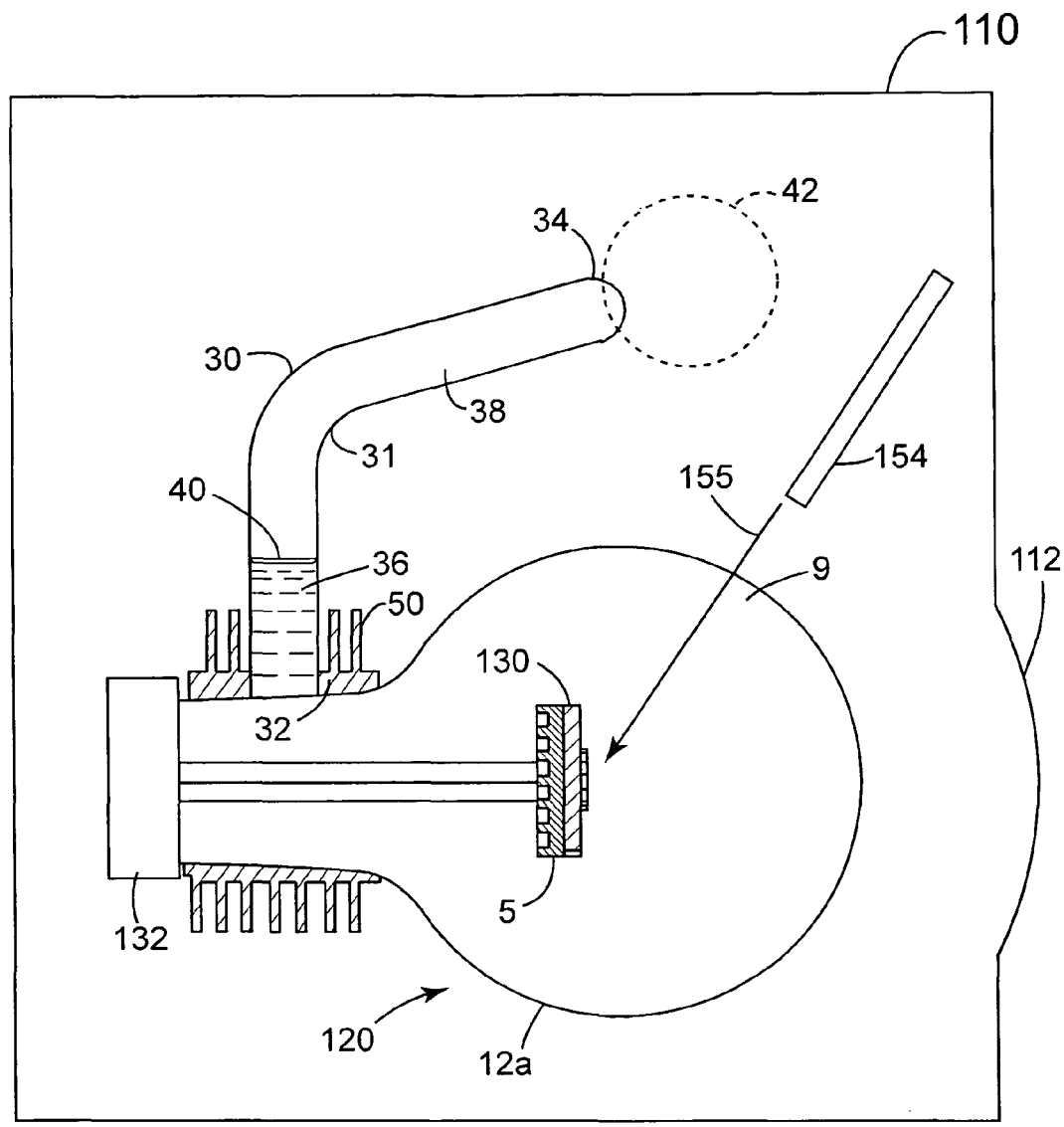
FIG. 6 is a side view of a fifth embodiment of a liquid-cooled light bulb.

FIG. 6 shows another embodiment of the invention. In FIG. 6, a housing 110, with an output aperture 112, contains a light bulb 120 and a laser 154. The light bulb 120 contains a light source 130, which is mounted on a heat sink 5, The light source 130 is a phosphor material, such as a powder phosphor or a ceramic phosphor in the form of a plate. The light bulb 120 of FIG. 6 is illuminated by the laser 154, whose output beam 155 is directed onto the phosphor plate 130. The bulb 130 also includes a mounting base 132 in order to be mounted on a fixture (not shown).

As the light emission efficiency of the phosphor is temperature dependent, and as the phosphor can be damaged by exposure to high temperature, the liquid cooling of the phosphor provides a light source which is more efficient and has a longer life. The light emitted by the phosphor can be used for general lighting, or coupled into fiber optics or projection engines. The phosphor can be selected to emit a desired color depending on the intended application and the laser can be blue or other colors depending on the phosphor used.

Figure 7A:
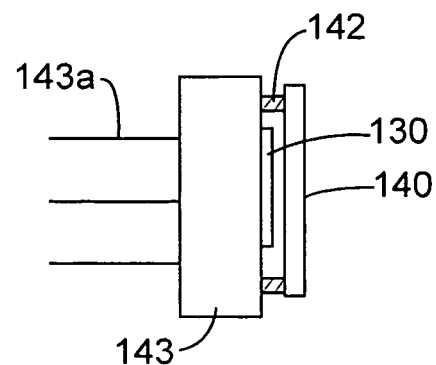
FIGS. 7 (*a*) and (*b*) are side and front views of a sixth embodiment of a liquid-cooled light bulb.
Figure 7B:
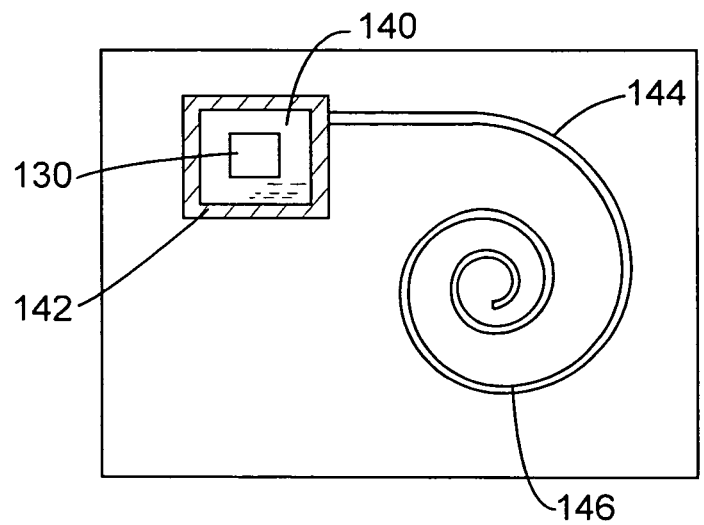

FIGS. 7a and 7b show another embodiment of the liquid cooled light bulb with the ceramic phosphor (in general, phosphor powder deposited on top of the heat sink by appropriate means) excited by an external laser beam. In this configuration, the ceramic phosphor 130 is mounted on top of a heat sink 143 having fins 143a and covered with a flat window 140 which is spaced from the phosphor by a spacer 142 such that the liquid will be covering the ceramic phosphor such that the phosphor can be cooled effectively. The expansion tube 144, filled with liquid and air separated by a meniscus 146 is can be made part of the heat sink as shown such that the unit is self contained and if flat. Such configuration will be especially advantageous for use with projection engines.

The foregoing description represents the preferred embodiments of the invention. Variations and modifications will be apparent to persons skilled in the art, without departing from the inventive concepts disclosed. For example, the bulb 12a can be made of glass or any other suitable transparent material such as plastic. The LED or LEDs may be blue or white or a combination of colors. In the case of using blue LEDs, the bulb may be coated with fluorescent materials of various colors producing colored light or white light.

The expansion tube can be made of metal, plastic, or other materials that can be coiled tightly inside a chamber. If desired, the expansion tube can be made of metal and coiled such that it can function as a heat sink.

The socket 17 can be a standard Edison bulb socket with screw threads, can be prongs like standard MR-16 bulbs, or can be other types of electrical connectors.

Although the exemplary embodiments disclosed in applications for light bulbs, the same inventive features can be applied to provide an improved heat sink of electronic modules with electronic components that generate heat but do not emit light. All such modifications and variations are intended to be within the scope of the invention, as set forth in the following claims.

The invention claimed is:

1. An electric device comprising:
a container having a sealed interior, an electrical component contained within said interior which in operation generates heat; a liquid coolant filling said interior; and a pressure relief member having an interior tubular passage, said tubular passage having an inlet which is in fluid communication with said liquid; wherein said tubular passage is always partially filled with liquid extending from said inlet partially toward an outer end of said passage, wherein the remainder of said passage is filled with gas, and wherein the liquid inside the tubular passage contacts the gas and forms a meniscus at the liquid/gas interface.

2. The electrical device of claim 1, further comprising a heat sink having a portion coupled to said electrical component and another portion in contact with said liquid coolant.

3. The electrical device of claim 1, wherein said expansion member is an expansion tube located exterior to said container.

4. The electrical device of claim 3, wherein said expansion tube has an outer end which is closed.

5. The electrical device of claim 3, wherein said expansion tube has an outer end which is open, wherein said expansion tube has sufficient length to prevent liquid from overflowing said outer end.

6. The electrical device of claim 2, wherein said expansion tube has an outer end, and further comprising an expansion chamber which is in fluid communication with said outer end.

7. The electrical device of claim 3, wherein said expansion tube wraps helically about a portion of said container and has an outer end which is closed.

8. The electrical device of claim 1, wherein said expansion member comprises a frusto-conical member having a longitudinal axis, a shell, and an inner core member; wherein said tubular passage is located on an outer surface of said core member, and extends beneath said shell helically from said inlet in an axial direction.

9. The electrical device of claim 3, wherein said expansion member is an expansion tube located within said interior; wherein said expansion tube has an outer end which is closed; and wherein said passage has a diameter which is small enough to prevent gas from flowing out of said passage into said liquid.

10. A light bulb having a socket and a bulb portion having a sealed interior, at least one LED contained within said interior; a liquid filling said interior; and a pressure relief member having an interior tubular passage, said tubular passage having an inlet which is in fluid communication with said liquid coolant; wherein said tubular passage is always partially filled with liquid which extends from said inlet partially toward an outer end of said passage, wherein the remainder of said passage is filled with gas, and wherein the liquid inside the tubular passage contacts the gas and forms a meniscus at the liquid/gas interface.

11. The light bulb of claim 10, further comprising a heat sink having a portion coupled to said electrical component and another portion in contact with said liquid coolant.

12. The light bulb of claim 10, wherein said expansion member is an expansion tube located exterior to said container.

13. The light bulb of claim 12, wherein said expansion tube has an outer end which is closed.

14. The light bulb of claim 12, wherein said expansion tube has an outer end which is open, wherein expansion tube has sufficient length to prevent liquid from overflowing said outer end.

15. The light bulb of claim 11, wherein said expansion tube has an outer end, and further comprising an expansion chamber which is in fluid communication with said outer end.

16. The light bulb of claim 12, wherein said light bulb includes a bulb portion and a neck portion, and wherein said expansion tube wraps helically about said neck portion and has an outer end which is closed.

17. The light bulb of claim 10, wherein said expansion member comprises a frusto-conical member having a longitudinal axis, a shell, and an inner core member; wherein said tubular passage is located on an outer surface of said core member, and extends beneath said shell helically from said inlet in an axial direction.

18. The light bulb of claim 12, wherein said expansion member is an expansion tube located within said interior; wherein said expansion tube has an outer end which is closed;

and wherein said passage has a diameter which is small enough to prevent gas from flowing out of said passage into said liquid coolant.

19. A light-generating device with improved heat sink properties comprising: a container having a sealed interior, a light-generating element contained within said interior; a liquid coolant filling said interior; and a pressure relief member having an interior tubular passage, said tubular passage having an inlet which is in fluid communication with said liquid; wherein said tubular passage is partially filled with liquid extending from said inlet partially toward an outer end of said passage, and wherein the remainder of said passage is filled with gas.

20. The light-generating device of claim 19, wherein said light-generating element is a phosphor material.

* * * * *